(12) United States Patent
Nakano et al.

(10) Patent No.: US 11,180,303 B2
(45) Date of Patent: Nov. 23, 2021

(54) STORAGE CONTAINER OF SCRUBBING MEMBER AND PACKAGE OF SAME

(71) Applicant: EBARA CORPORATION, Tokyo (JP)

(72) Inventors: Hisajiro Nakano, Tokyo (JP); Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 332 days.

(21) Appl. No.: 16/322,400

(22) PCT Filed: Nov. 14, 2018

(86) PCT No.: PCT/JP2018/042109
§ 371 (c)(1),
(2) Date: Jan. 31, 2019

(87) PCT Pub. No.: WO2019/098229
PCT Pub. Date: May 23, 2019

(65) Prior Publication Data
US 2021/0163208 A1 Jun. 3, 2021

(30) Foreign Application Priority Data

Nov. 14, 2017 (JP) .............................. JP2017-219223

(51) Int. Cl.
*A46B 17/04* (2006.01)
*B65D 81/26* (2006.01)
*H01L 21/67* (2006.01)
*B65D 43/02* (2006.01)

(52) U.S. Cl.
CPC ...... *B65D 81/266* (2013.01); *H01L 21/67046* (2013.01); *B65D 43/02* (2013.01)

(58) Field of Classification Search
CPC ............ A46B 17/04; A46B 2200/1066; H01L 21/6732; H01L 21/67326; H01L 21/6734; H01L 21/67379; H01L 21/67046; B65D 81/266; B65D 43/02
USPC ........................................................ 206/204
See application file for complete search history.

(56) References Cited

U.S. PATENT DOCUMENTS

| 2,655,968 | A | * | 10/1953 | Simmons | ............... A46B 17/04 15/247 |
| 3,746,162 | A | * | 7/1973 | Bridges | ................. A46B 17/04 206/361 |
| 6,412,134 | B1 | | 7/2002 | Oikawa | |
| 2004/0050732 | A1 | * | 3/2004 | Baker | .................... A46B 17/04 206/361 |

(Continued)

FOREIGN PATENT DOCUMENTS

| CN | 1794028 A | 6/2006 |
| CN | 204450325 U | 7/2015 |
| JP | U51-113702 A | 9/1976 |

(Continued)

*Primary Examiner* — King M Chu
(74) *Attorney, Agent, or Firm* — BakerHostetler

(57) ABSTRACT

A storage container of a scrub member includes a container main body and a lid body engaging with the container main body, where the scrub member is accommodated in an internal portion of the storage container surrounded by the container main body and the lid body, and a ventilation groove which communicates the internal portion of the storage container and an outside of the storage container is formed on an engagement surface where the container main body and the lid body are engaged.

6 Claims, 7 Drawing Sheets

(56) References Cited

U.S. PATENT DOCUMENTS

2017/0271092 A1    9/2017   Ishii et al.

FOREIGN PATENT DOCUMENTS

| | | |
|---|---|---|
| JP | 2000-173966 A | 6/2000 |
| JP | 2003-017454 A | 1/2003 |
| JP | 2003-292562 A | 10/2003 |
| JP | 2008-068900 A | 3/2008 |
| JP | 2009-012803 A | 1/2009 |
| JP | 2014-508687 A | 4/2014 |
| JP | 2015-110445 A | 6/2015 |
| JP | 2015-181153 A | 10/2015 |
| WO | WO 2012/106237 A1 | 8/2012 |

* cited by examiner

STORAGE CONTAINER OF SCRUBBING MEMBER AND PACKAGE OF SAME

CROSS-REFERENCE TO RELATED APPLICATION

This application is based upon and claims benefit of priority from International Patent Application PCT/JP2018/042109, filed Nov. 14, 2018 and Japanese Patent Application No. 2017-219223, filed Nov. 14, 2017, the contents of which are hereby incorporated herein.

BACKGROUND ART

Conventionally, as a scrubbing member, for example, a cleaning member to be mounted on a substrate cleaning apparatus described in the following Patent Literature 1 is known. The cleaning member is held by a cleaning member holding mechanism and scrubs a surface of a substrate while rotating. The cleaning member holding mechanism includes a holding member (sleeve) having a lower portion divided into a plurality of chuck claws and a ring member to be fitted into an outer periphery of the holding member, and adopts a collet chuck structure in which an end portion of the cleaning member is inserted into an insertion hole formed of the plurality of chuck claws of the holding member, and the ring member is fitted into the outer periphery of the holding member to tighten and fix the cleaning member with the plurality of chuck claws.

PRIOR ART DOCUMENTS

Patent Documents

Patent Document 1
  Japanese Unexamined Patent Application, First Publication No. 2000-173966 A

DISCLOSURE OF INVENTION

Problems to be Solved by the Invention

Such a scrubbing member is housed in a storage container in order to prevent deformation and contamination. The scrubbing member is weathered and generates dust when dried, and therefore is preferably housed in a storage container in a wet state. However, in this case, bacteria may grow in the scrubbing member and contaminate the scrubbing member. For this reason, conventionally, a ventilation hole is formed in a storage container, and the scrubbing member is stored together with an oxygen absorbent for suppressing growth of bacteria in a package covering the storage container. However, the ventilation hole of the storage container is formed by post-processing. Therefore, burrs that damage the scrubbing member may be generated around the ventilation hole, or the burrs may adhere to the scrubbing member and generate particles.

The present invention has been achieved in view of the above circumstances, and provides a storage container of a scrubbing member capable of suppressing deformation and contamination of the scrubbing member and generation of particles, and a package thereof.

Means for Solving the Problems (1) A first aspect of the present invention is a storage container of a scrub member including a container main body and a lid body engaging with the container main body, in which the scrub member is accommodated in an internal portion of the storage container surrounded by the container main body and the lid body, and a ventilation groove which communicates the internal portion of the storage container and an outside of the storage container is formed on an engagement surface where the container main body and the lid body are engaged.

(2) The storage container of a scrubbing member according to (1) described above, in which a plurality of the ventilation grooves may be formed in the engagement surface.

(3) The storage container of a scrubbing member according to (1) or (2) described above, in which the container main body may have an engagement groove which can be engaged with the scrubbing member.

(4) The storage container of a scrubbing member according to (3) described above, in which the container main body may have an annular wall forming a side surface of the engagement groove with an inner wall surface, and the ventilation groove may be formed in an outer wall surface of the annular wall.

(5) The storage container of a scrubbing member according to (4) described above, in which the scrubbing member may include a main body portion having a scrubbing surface and a protrusion protruding from the main body portion toward the opposite side to the scrubbing surface, and a top surface of the annular wall may not be in contact with the main body portion when the protrusion is engaged with the engagement groove.

(6) The storage container of a scrubbing member according to (5) described above, in which the lid body may be engaged with the container main body with a gap equal to or smaller than the depth of the engagement groove with respect to the scrubbing surface of the main body portion.

(7) The storage container of a scrubbing member according to (5) or (6), in which the lid body may have a plurality of protruding portions protruding toward the scrubbing surface of the main body portion.

(8) A package of a scrubbing member according to an aspect of the present invention, including the storage container of a scrubbing member according to any one of (1) to (7) and an oxygen absorbent disposed outside the storage container.

Effects of the Invention

According to an aspect of the present invention, deformation and contamination of a scrubbing, member and generation of particles can be, suppressed.

EMBODIMENTS FOR CARRYING OUT THE INVENTION

Hereinafter, an embodiment of the present invention will be described with reference to the drawings.

Figure 1:
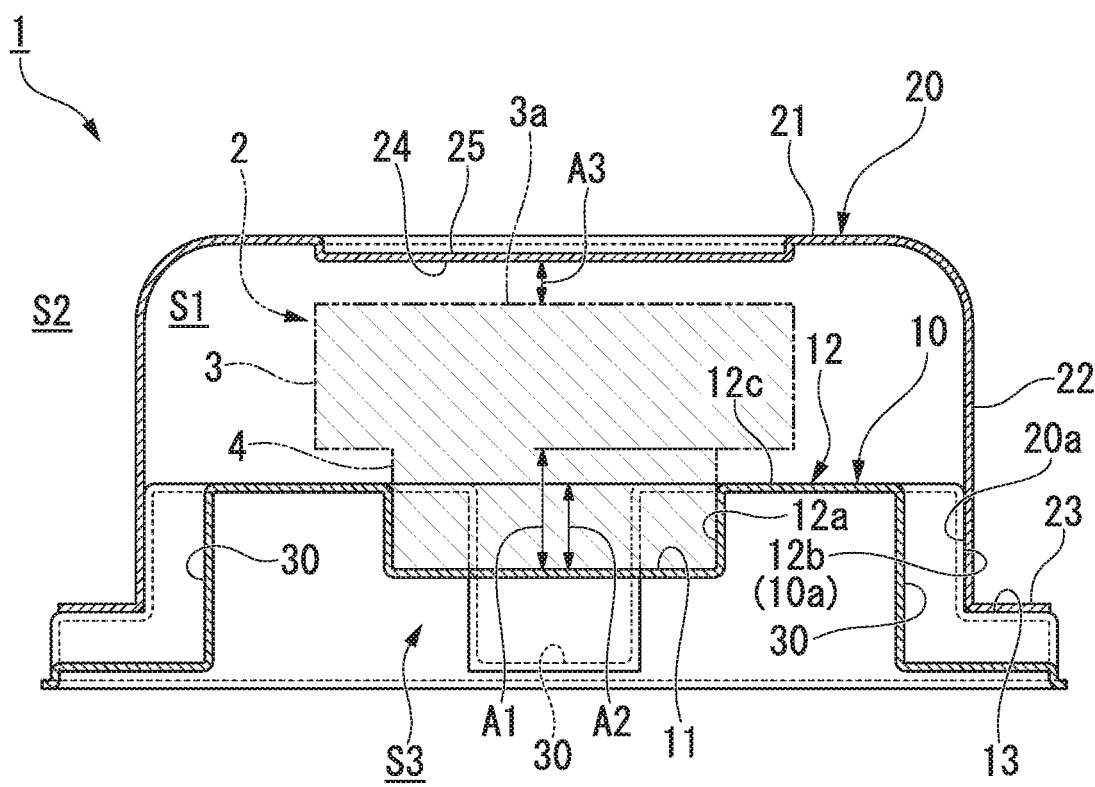
FIG. 1 is a cross-sectional view of a storage container 1 of a scrubbing member 2 according to an embodiment.

FIG. 1 is a cross-sectional view of a storage container 1 of a scrubbing member 2 according to the embodiment.

As illustrated in the drawing, the storage container 1 includes a container main body 10 and a lid body 20 engaged with the container main body 10. The storage container 1 houses the scrubbing member 2 in a container interior S1 surrounded by the container main body 10 and the lid body 20. Incidentally, in the following description, an exterior of the container main body 10 and the lid body 20 excluding the container interior S1 is referred to as a container exterior S2.

The storage container 1 is made of a transparent plastic material. Examples of the plastic material forming the storage container 1 include polyethylene (PE), polyethylene terephthalate (PET), polypropylene (PP), and other general-purpose plastic materials. The container main body 10 and the lid body 20 are preferably vacuum molded products formed by, for example, bringing a plastic material softened by heat into close contact with a predetermined molding die by vacuuming and cooling the plastic material.

Figure 2A:
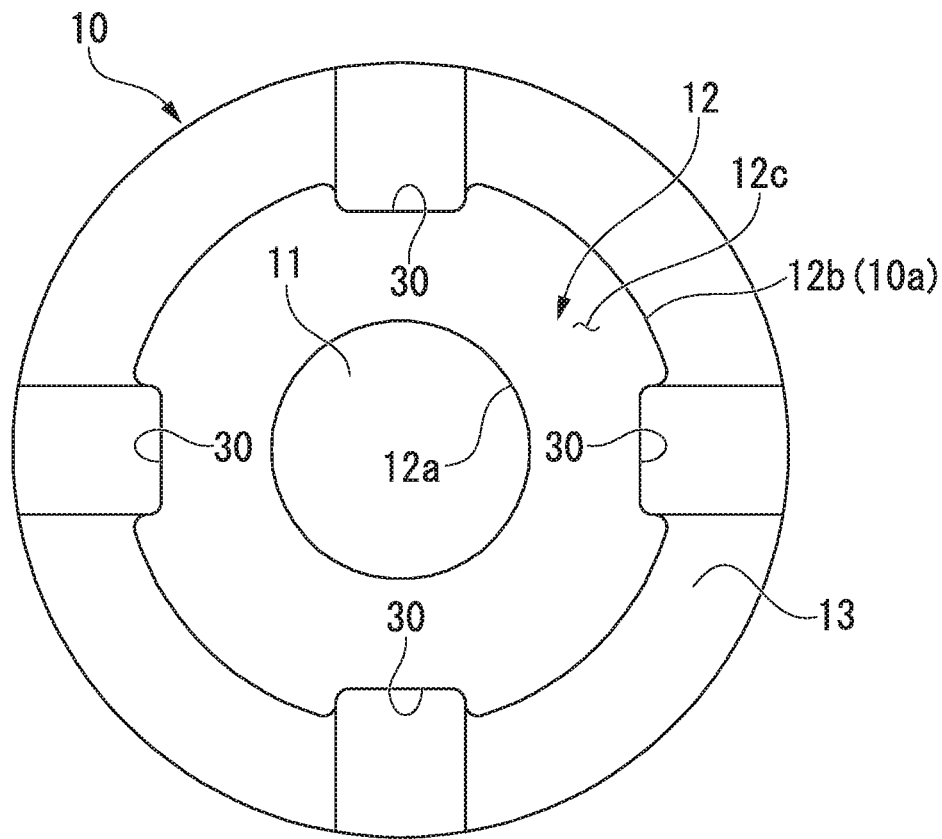
FIG. 2A is a plan view of a container main body 10 according to the embodiment.
Figure 2B:
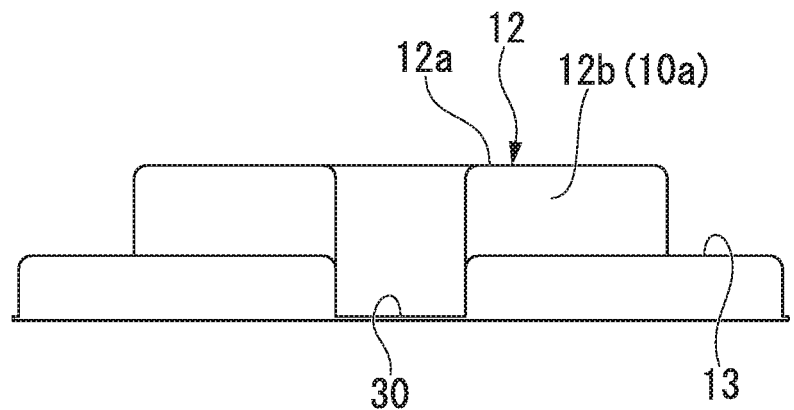
FIG. 2B is a front view of the container main body 10 according to the embodiment.
Figure 3A:
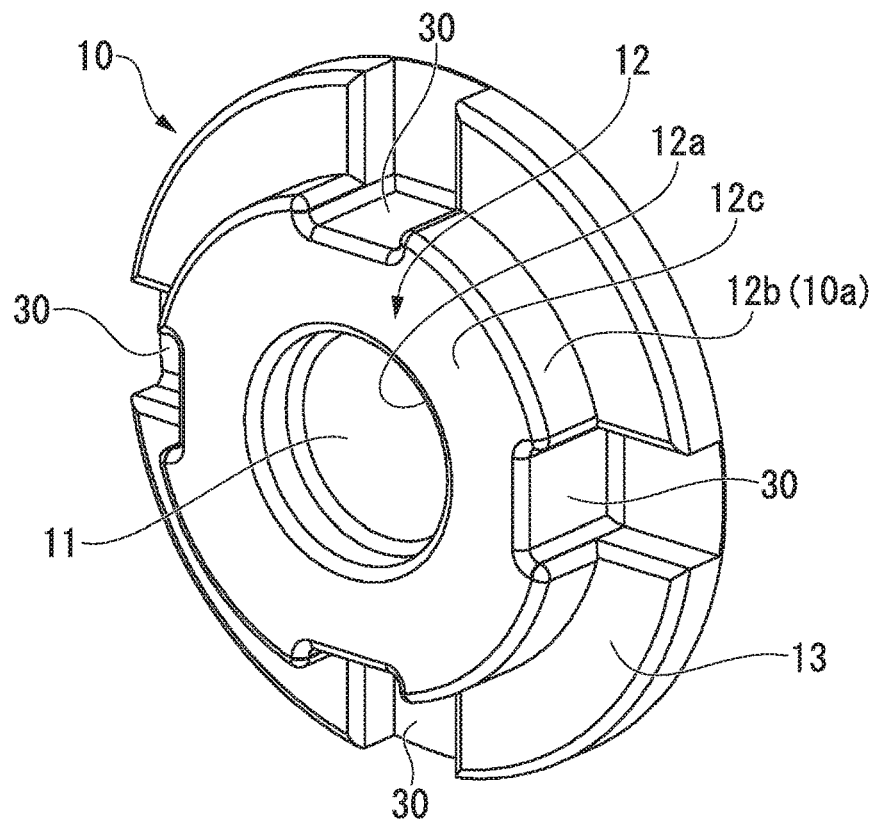
FIG. 3A is a plane side perspective view of the container main body 10 according to the embodiment.
Figure 3B:
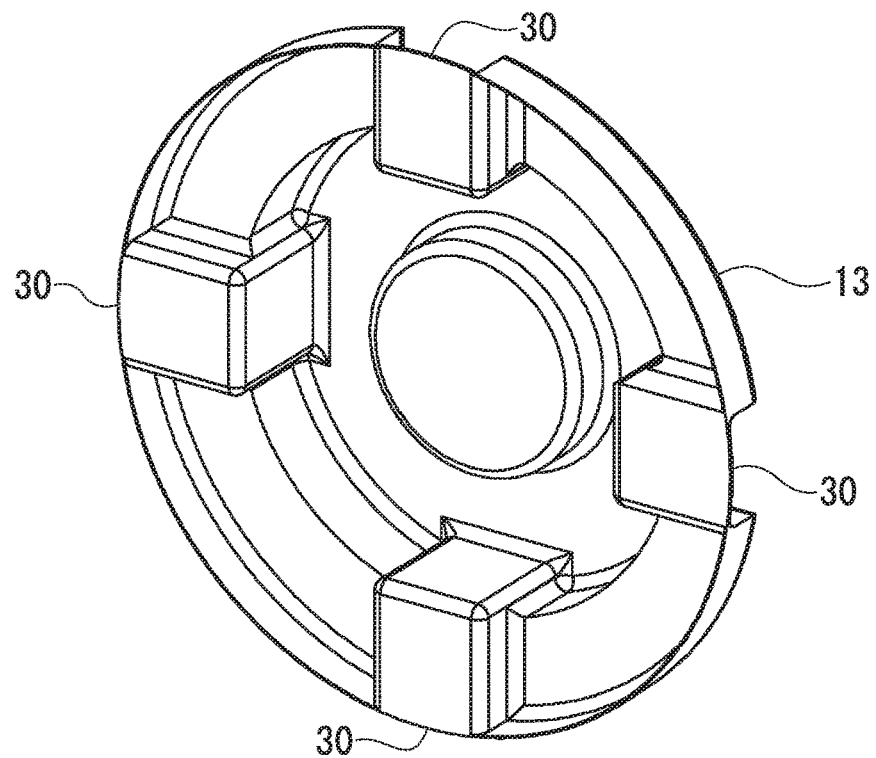
FIG. 3B is a bottom side perspective view of the container main body 10 according to the embodiment.

FIG. 2A is a plan view of the container main body 10 according to the embodiment, and FIG. 2B is a from view of the container main body 10 according to the embodiment. FIG. 3A is a plane side perspective view of the container main body 10 according to the embodiment, and FIG. 3B is a bottom side perspective view of the container main body 10 according to the embodiment.

As illustrated in these drawings, the container main body 10 has an engagement groove 11, an annular wall 12, and a flange portion 13. The engagement groove 11 is formed at the center of the container main body 10. The engagement groove 11 of the present embodiment has a bottomed cylindrical shape.

The annular wall 12 is an annular protrusion annularly formed around the engagement groove 11. The annular wall 12 forms a side surface of the engagement groove 11 with an inner wall surface 12a. An outer wall surface 12b of the annular wall 12 forms an engagement surface 10a with the lid body 20. The engagement surface 10a has a ventilation groove 30 formed therein. Four ventilation grooves 30 are formed at intervals of 90° around the engagement groove 11 in the plan view illustrated in FIG. 2A.

The flange portion 13 annularly extends from a lower end of the outer wall surface 12b of the annular wall 12 to the outside in a radial direction, the flange portion 13 also has the ventilation groove 30 formed therein. That is, the ventilation groove 30 is formed from an upper end to a lower end of the outer wall surface 12b of the annular wall 12 and is bent and formed from an inner edge to an outer edge of the flange portion 13. For this reason, the ventilation groove 30 is formed in an L shape in the cross-sectional view illustrated in FIG. 1.

Figure 4A:
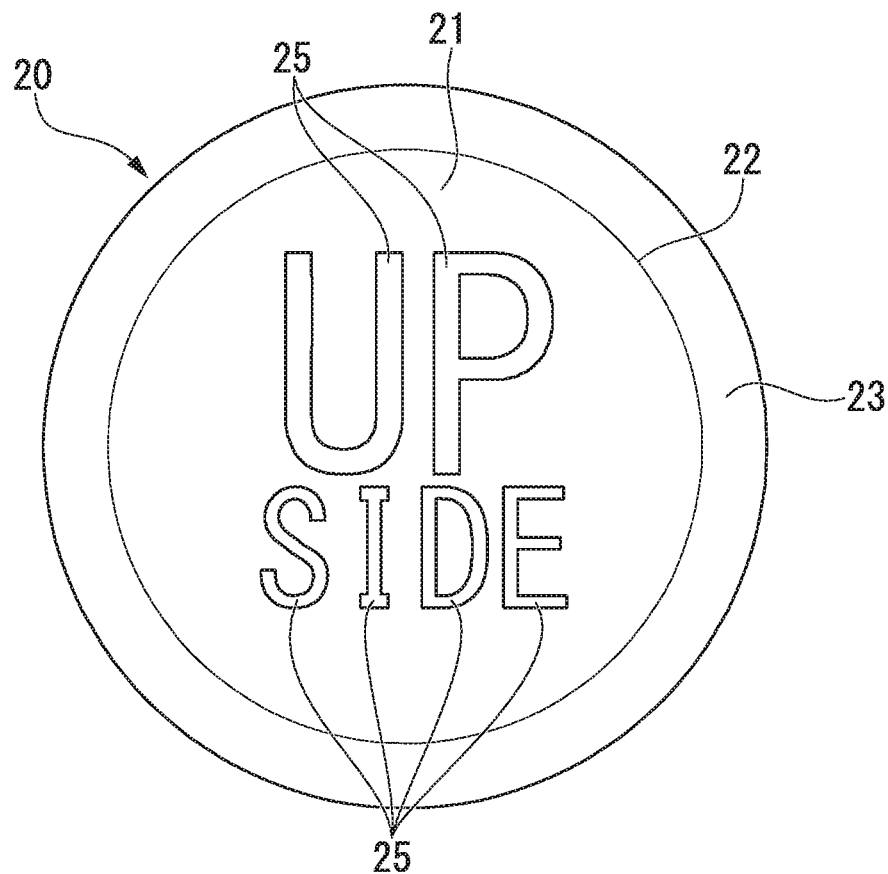
FIG. 4A is a plan view of a lid body 20 according to the embodiment.
Figure 5A:
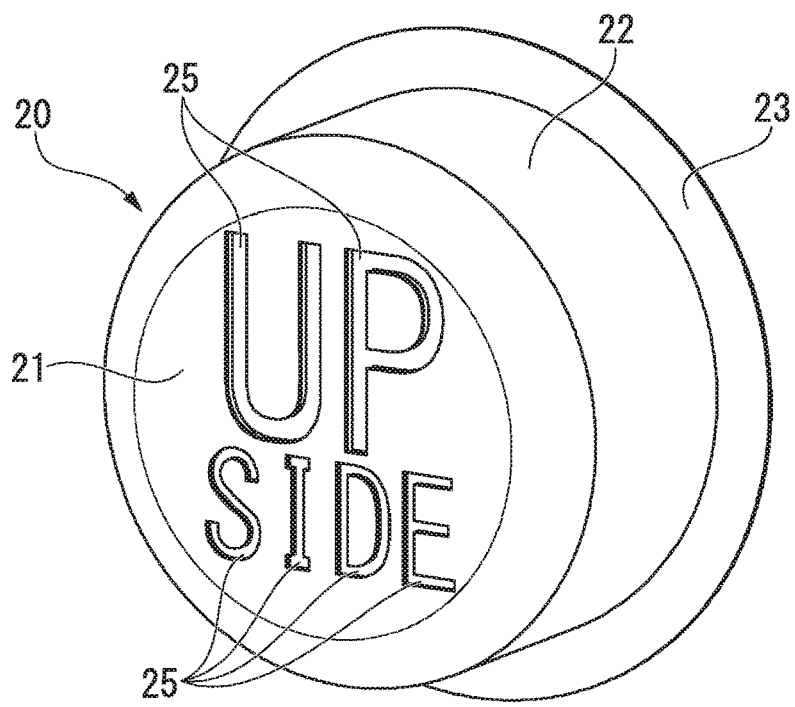
FIG. 5A is a plane side perspective view of the lid body 20 according to the embodiment.
Figure 5B:
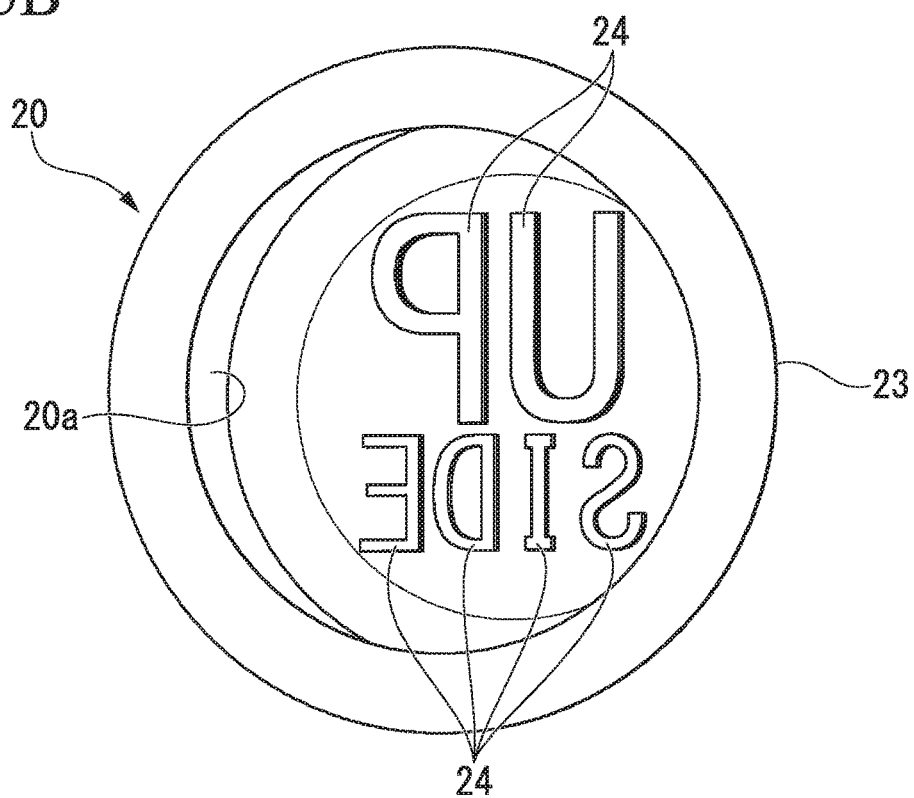
FIG. 5B is a bottom side perspective view of the lid body 20 according to the embodiment.

FIG. 4A is a plan view of the lid body 20 according to the embodiment, and FIG. 4D is a front view of the lid body 20 according to the embodiment. FIG. 5A is a plane side perspective view of the lid body 20 according to the embodiment, and FIG. 5B is a bottom side perspective view of the lid body 20 according to the embodiment.

As illustrated in these drawings, the lid body 20 has an upper surface portion 21, a side surface portion 22, and a flange portion 23. The upper surface portion 21 is formed in a disk shape having an outer diameter substantially the same as the outer diameter of the annular wall 12.

On a surface of the upper surface portion 21, as illustrated in FIGS. 4A and 5A, a plurality of recessed portions 25 are formed with a fixed depth. The plurality of recessed portions 25 form an engraved mark (letters) "UP SIDE" indicating an upper surface of the storage container 1. On a hack surface of the upper surface portion 21, a plurality of protruding portions 24 corresponding to the plurality of recessed portions 25 are formed as illustrated in FIG. 5B. The formation area of the plurality of protruding portions 24 is smaller than the area of a plane portion of the back surface of the upper surface portion 21.

Figure 4B:
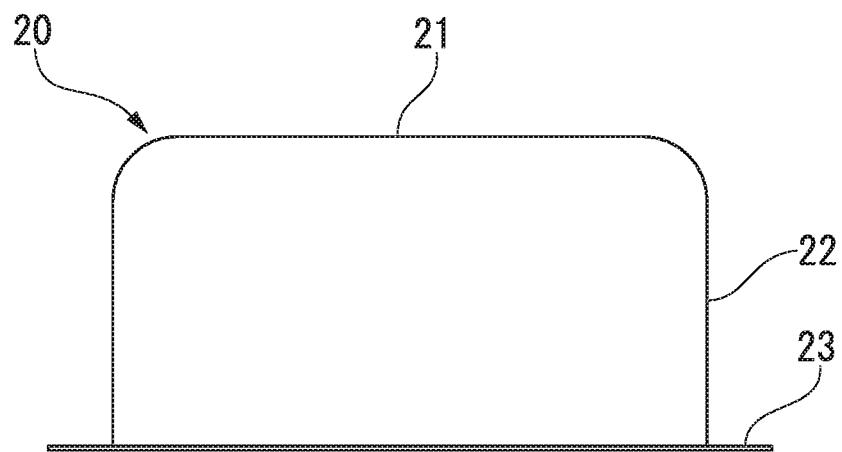
FIG. 4B is a front view of the lid body 20 according to the embodiment.

As illustrated in FIG. 4B, the side surface portion 22 has a substantially cylindrical shape extending downward from an outer edge of the upper surface portion 21. As illustrated in FIG. 1, a length from an upper end to a lower end of the side surface portion 22 is longer than a length from an upper end (top surface 12c) to a lower end (flange portion 13) of the outer wall surface 12b of the annular wall 12. An inner surface of the lower end portion of the side surface portion 22 is an engagement surface 20a engaged with the outer wall surface 12b (engagement surface 10a) of the annular wall 12.

The flange portion 23 annularly extends from a lower end of the side surface portion 22 to the outside in a radial direction. The flange portion 23 faces the flange portion 13 of the container main body 10 in an up-down direction. By bringing a lower surface of the flange portion 23 into contact with an upper surface of the flange portion 13, the lid body 20 is positioned with respect to the container main body 10 in an up-down direction. In addition, by engaging the inner surface of the lower end portion of the side surface portion 22 with the outer wall surface 12b of the annular wall 12, the lid body 20 is positioned with respect to the container main body 10 in a radial direction (front-rear direction and left-right direction).

As illustrated in FIG. 1, in the outer wall surface 12b (engagement surface 10a) of the annular wall 12 out of the engagement surfaces 10a and 20a where the container main body 10 is engaged with the lid body 20, the ventilation groove 30 which causes the container interior S1 to communicate with the container exterior S2 is formed. That is, the ventilation groove 30 is formed in a mating surface between the container main body 10 and the lid body 20. A plurality of ventilation grooves 30 are formed in the outer wall surface 12b (engagement surface 10a) of the annular wall 12 to form a plurality of ventilation flow paths.

The engagement groove 11 formed in the container main body 10 has an inner diameter which can be engaged with the scrubbing member 2. The scrubbing member 2 has a main body portion 3 having a scrubbing surface 3a and a protrusion 4 protruding from the main body portion 3 toward the opposite side to the scrubbing surface 3a. The scrubbing member 2 of the present embodiment is a pencil-shaped sponge to be mounted on a substrate cleaning apparatus, and is in a wet (moist) state with a preservation liquid such as pure water. Note that the scrubbing member 2 is not in such a wet state as the preservative liquid drips down.

A material of the scrubbing member 2 is not particularly limited as long as it is a liquid-absorbing porous material, but, for example, a polyvinyl alcohol (PVA) sponge (=porous substrate polyvinyl formal (PVF)) can be used. In addition, the scrubbing member 2 may be a plastic material (including soft and hard materials) with a cloth attached to the scrubbing surface 3a of the main body portion 3. As a material of the cloth, any material in which fine holes are formed on a surface thereof, and a foreign matter such as dust can be taken into the fine holes, such as a foamed urethane, a nonwoven fabric containing a fiber hardened with a urethane resin, or a suede type polishing cloth, may lie used.

The main body portion 3 is formed in a cylindrical shape having an outer diameter larger than the inner diameter of the engagement groove 11. One end face of the main body portion 3 is the circular scrubbing surface 3a. The scrubbing surface 3a is used in a downward direction when the scrubbing member 2 is mounted on a substrate cleaning apparatus. The protrusion 4 is formed in a cylindrical shape having an outer diameter smaller than that of the main body portion 3. An outer peripheral surface of the protrusion 4 is chucked when the scrubbing member 2 is mounted on a substrate cleaning apparatus. The protrusion 4 has an outer diameter substantially equal to the inner diameter of the engagement groove 11 (note that the outer diameter of the protrusion 4 may be slightly larger than the inner diameter of the engagement groove 11), and is engaged with the engagement groove 11.

As illustrated in FIG. 1, when the protrusion 4 is engaged with the engagement groove 11, the top surface 12c of the annular wall 12 is not in contact with the main body portion 3. That is, if the length of the protrusion 4 is represented by A1, and the depth of the engagement groove 11 is represented by A2, A1>A2 is preferably satisfied. Note that A1 is a length from an end face of the main body portion 3 on the opposite side to the scrubbing surface 3a to a tip of the protrusion 4. A2 is a depth from an opening end of the engagement groove 11 (equal to the top surface 12c of the annular wall 12) to a bottom surface of the engagement groove 11.

The lid body 20 is engaged with the container main body 10 with a gap equal to or smaller than, the depth of the engagement groove 11 with respect to the scrubbing surface 3a of the main body portion 3. That is, if the size of the gap between the lid body 20 and the scrubbing surface 3a is represented by A3, A2≥A3 is preferably satisfied. Note that A3 is a distance in an up-down direction from the scrubbing surface 3a of the main body portion 3 to a tip of the protruding portion 24 formed on the lid body 20. A relationship among A1, A2, and A3 is preferably A1>A2≥A3.

Figure 6:
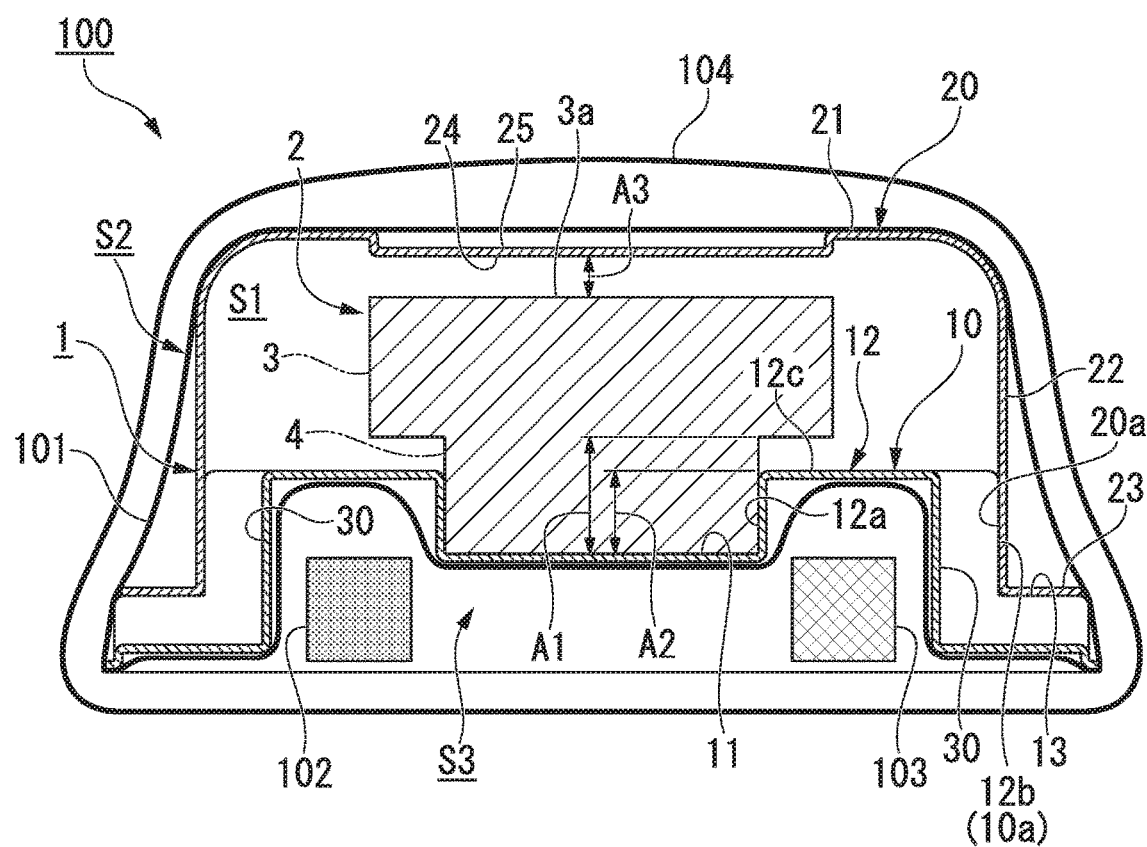
FIG. 6 is a cross-sectional view of a package 100 of the scrubbing member 2 according to the embodiment.

FIG. 6 is a cross-sectional view of a package 100 of the scrubbing member 2 according to the embodiment.

As illustrated in the drawing, the package 100 houses the above storage container 1 of the scrubbing member 2, an oxygen absorbent 102 which absorbs oxygen, and an oxygen detecting agent 103 which detects oxygen together. The storage container 1 is enclosed in a transparent inner bag 101 having air permeability. The storage container 1 enclosed in the transparent inner bag 101, the oxygen absorbent 102, and the oxygen detecting agent 103 are enclosed in a transparent outer bag 104. The outer bag 104 has a barrier property with lower air permeability than that of the inner bag 101.

The container main body 10 of the storage container 1 is a vacuum molded product, and has a space (back side space S3) of a certain size formed on the back side of the annular wall 12 or the like. The oxygen absorbent 102 and the oxygen detecting agent 103 are disposed in the back side space S3 (container exterior S2). This makes it possible to reduce the size of the package 100 and to prevent the oxygen absorbent 102 and the oxygen detecting agent 103 from entering the container interior S1 through the ventilation groove 30. Incidentally, in the case of some sizes of the outer bag 104, the oxygen absorbent 102 and the oxygen detecting agent 103 do not come out of the back side space S3, and therefore the inner bag 101 may be omitted.

Figure 7:
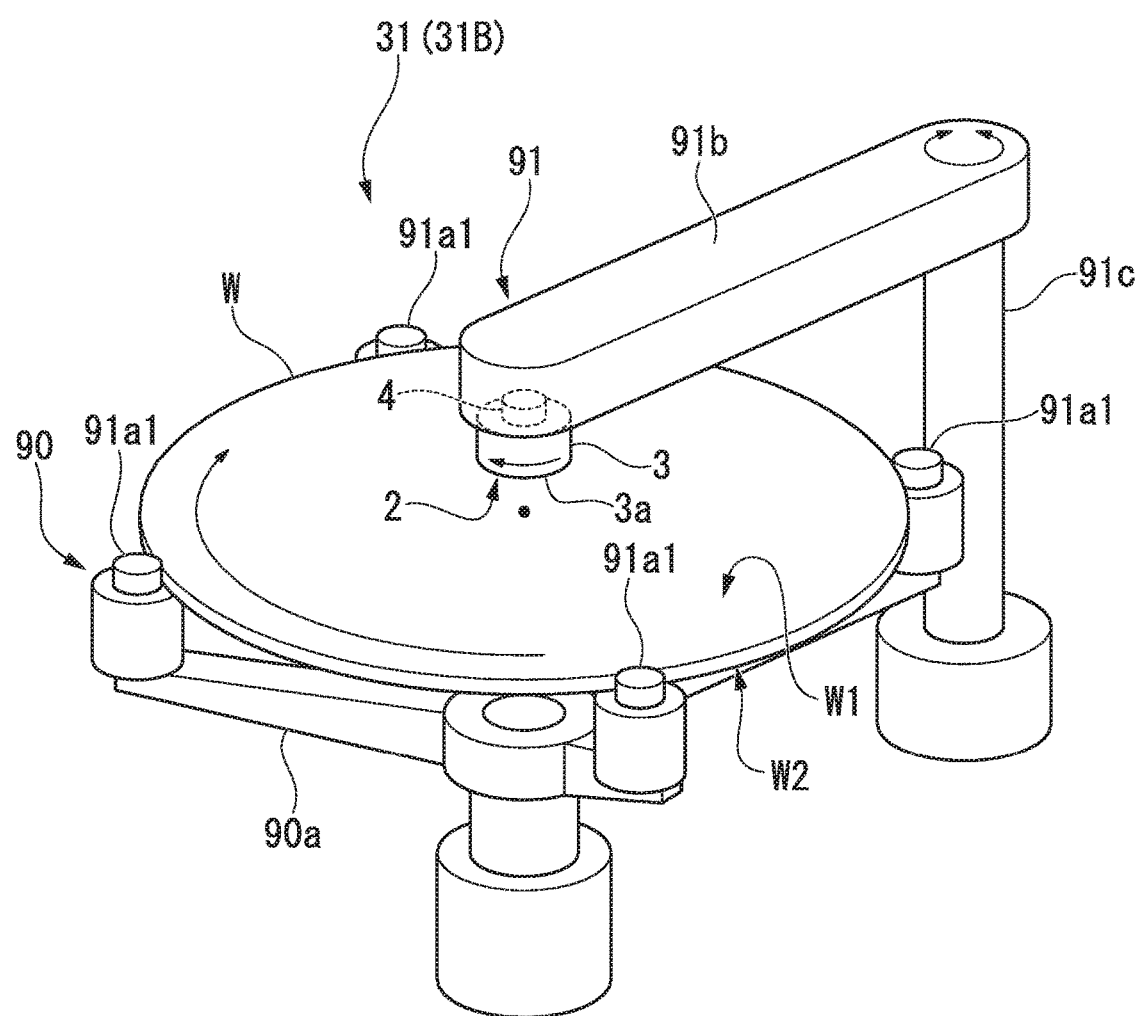
FIG. 7 is a perspective view of a substrate, cleaning apparatus 31 on which the scrubbing member 2 according to the embodiment is to be mounted.

FIG. 7 is a perspective view of a substrate cleaning apparatus 31 on which the scrubbing member 2 according to the embodiment is to be mounted.

The substrate cleaning apparatus 31 is, for example, a pencil-shaped cleaning module 31B as illustrated in FIG. 7. The cleaning module 31B includes a rotating mechanism 90 which rotates a substrate W (for example, a semiconductor substrate) and a pencil cleaning mechanism 91 which rotates while bringing the scrubbing surface 3a of the scrubbing member 2 into contact with the substrate W. The rotating mechanism 90 includes a plurality of chucks 90a1 holding an outer periphery of the substrate W and a rotating stage 90a which rotates the substrate W about an axis extending in the vertical direction. The rotating stage 90a is connected to an electric drive unit such as a motor and horizontally rotates on a lower surface. W2 side of the substrate W.

The pencil cleaning mechanism 91 includes the scrubbing member 2 and an arm 91b holding the scrubbing member 2. The scrubbing member 2 is mounted on a tip portion of the arm 91b and rotates about an axis extending in the vertical direction by an electric drive unit such as a motor disposed inside the arm 91b. The arm 91b is disposed above the substrate W. A pivot 91c is connected to a proximal end portion of the arm 91b. To the pivot 91c, an electric drive unit such as a motor which turns the arm 91b is connected. The arm 91b turns, around the pivot 91c in a plane parallel to the substrate W. That is, as the arm 91b turns, the scrubbing member 2 supported by the arm 91b moves in a radial direction of the substrate W. and an upper surface W1 (pattern surface) of the substrate W is scrubbed.

Next, operation of the storage container 1 of the scrubbing member 2 will be described.

As illustrated in FIG. 1, the storage container 1 of the scrubbing member 2 includes the container main body 10 and the lid body 20 engaged with the container main body 10, and houses the scrubbing member 2 in the container interior S1 surrounded by the container main body 10 and the lid body 20. The ventilation groove 30 is formed in the engagement surface 10a where the container main body 10 is engaged with the lid body 20. The ventilation groove 30 causes the container interior S1 to communicate with the container exterior S2 to prevent generation of mold in the container interior S1 (scrubbing member 2).

The ventilation groove 30 is formed in a mating surface between the container main body 10 and the lid body 20, is not formed by post-processing (for example, perforation such as drilling), and therefore does not generate burrs. Therefore, burrs do not damage the scrubbing member 2, and do not adhere to the scrubbing member 2 or form particles. Therefore, such a storage container 1 of the scrubbing member 2 can suppress deformation and contamination of the scrubbing member 2 and generation of particles.

In the present embodiment, the plurality of ventilation grooves 30 are formed in the engagement surface 10a. According to such a configuration, the plurality of ventilation grooves 30 can form an air inlet and an air outlet in the storage container 1. Therefore, air permeability of the storage container 1 is improved. In addition, the plurality of ventilation grooves 30 increase the total flow path area of the ventilation flow path. Therefore, air permeability of the storage container 1 is improved.

In addition, in the present embodiment, the container main body 10 has the engagement groove 11 which can be engaged with the scrubbing member 2. According to such a configuration, the scrubbing member 2 is positioned in the container interior S1 and does not move freely. Therefore, for example, it is possible to eliminate concern of an edge portion of the scrubbing member 2 hitting an inner surface of the storage container 1 and causing deformation.

Furthermore, in the present embodiment, the container main body 10 has the annular wall 12 forming a side surface of the engagement groove 11 with the inner wall surface 12a, and the ventilation groove 30 is formed in the outer wall surface 12b of the annular wall 12. According to such a configuration, even in a case where a preservation liquid is accumulated m the engagement groove 11 engaged with the scrubbing member 2, the annular wall 12 serves as a levee. Therefore, it is possible to prevent leakage of a liquid through the ventilation groove 30 from the engagement groove 11.

In the present embodiment, the scrubbing member 2 has the main body portion 3 having the scrubbing surface 3a and the protrusion 4 protruding from the main body portion 3 toward the opposite side to the scrubbing surface 3a, and the top surface 12c of the annular wall 12 is not in contact with the main body portion 3 when the protrusion 4 is engaged with the engagement groove 11. According to such a configuration, it is possible to prevent the main body portion 3 from coming into contact with the top surface 12c of the annular wall 12 and being deformed or contaminated.

In addition, in the present embodiment, the lid body 20 is engaged with the container main body 10 with a gap equal to or smaller than the depth of the engagement groove 11 with respect to the scrubbing surface 3a of the main body portion 3. According to such a configuration, for example, even if the storage container 1 receives an impact or the like during transportation, the scrubbing member 2 does not escape dimensionally from the engagement groove 11. Therefore, deformation and contamination of the scrubbing member 2 can be prevented. In addition, the lid body 20 has the plurality of protruding portions 24 protruding toward the scrubbing surface 3a of the main body portion 3. Therefore, the contact area with the scrubbing surface 3a can be reduced to prevent deformation and contamination of the scrubbing surface 3a.

A preferred embodiment of the present invention has been described and explained above. However, it should be understood that this is exemplary of the present invention and should not be considered restrictively. Additions, omissions, substitutions, and other changes can be made without departing from the scope of the present invention. Therefore, the present invention should not be regarded as being limited by the above description, but is limited only by the claims.

For example, the above embodiment has illustrated a configuration in which the plurality of ventilation grooves 30 are formed. However, as long as the flow path area of a ventilation flow path can be secured, the number of the ventilation grooves 30 may be one.

In addition, fir example, the above embodiment has illustrated a configuration in which the ventilation groove 30 is formed in the engagement surface 10a of the container main body 10. However, the ventilation groove 30 may be formed in the engagement surface 20a of the lid body 20, or may be formed on both the engagement surface 10a of the container main body 10 and the engagement surface 20a of the lid body 20.

In addition, for example, the above embodiment has illustrated a configuration in which the outer shape of the main body portion 3 of the scrubbing member 2 is larger than the outer shape of the protrusion 4. However, the outer shape of the main body portion 3 may be smaller than the outer shape of the protrusion 4.

In addition, for example, the above embodiment has illustrated a configuration in which the engagement groove 11 of the container main body 10 is formed in a circular shape in a plan view. However, the engagement groove 11 may have any shape as long as the shape corresponds to the shape of the scrubbing member 2. For example, the engagement groove 11 may be a rectangle, another polygon, or another shape. A positioning pin which positions the scrubbing member 2 may be formed on a bottom surface of the engagement groove 11.

In addition, for example, the above embodiment has illustrated a configuration in which the plurality of recessed portions 25 formed in the lid body 20 forms the letters "UP SIDE". However, other letters or patterns may be formed. However, in order to prevent application of a local load to the scrubbing surface 3a of the scrubbing member 2, the plurality of recessed portions 25 (protruding portions 24) are preferably laid out so as to spread substantially uniformly in a region facing the scrubbing surface 3a.

In addition, for example, the above embodiment has illustrated a configuration in which the storage container 1 houses the pencil-shaped sponge of the substrate cleaning apparatus 31. However, for example, the storage container 1 may house a polishing member (scrubbing member) of a substrate polishing apparatus which scrubs a substrate.

DESCRIPTION OF THE REFERENCE SYMBOLS

1: Storage container
2: Scrubbing member
3: Main body portion
3a: Scrubbing surface
4: Protrusion
10: Container main body
10a: Engagement surface
11: Engagement groove
12: Annular wall
12a: Inner wall surface
12b: Outer wall surface
12c: Top surface
20: Lid both
20a: Engagement surface
24: Protruding portion
100: Package
102: Oxygen absorbent
S1: Container interior
S2: Container exterior

The invention claimed is:
1. A storage container comprising a container main body and a lid body engaging with the container main body, wherein
a ventilation groove which communicates an internal portion of the storage container and an outside of the storage container is formed on an engagement surface where the container main body and the lid body are engaged, the internal portion accommodating a scrub member and surrounded by the container main body and the lid body, the container main body has an engagement groove which can be engaged with the scrubbing member, the container main body has an annular wall forming a side surface of the engagement groove with an inner wall surface, and the ventilation groove is formed in an outer wall surface of the annular wall.

2. The storage container according to claim 1, wherein a plurality of the ventilation grooves are formed in the engagement surface.

3. The storage container according to claim 1, wherein
the scrubbing member includes a main body portion having a scrubbing surface and a protrusion protruding from the main body portion toward an opposite side to the scrubbing surface, and
   a top surface of the annular wall is not in contact with the main body portion when the protrusion is engaged with the engagement groove.

4. The storage container according to claim 3, wherein the lid body is engaged with the container main body with a gap equal to or smaller than a depth of the engagement groove with respect to the scrubbing surface of the main body portion.

5. The storage container according to claim 3, wherein the lid body has a plurality of protruding portions protruding toward the scrubbing surface of the main body portion.

6. A package, comprising:
the storage container comprising a container main body and a lid body engaging with the container main body; and
an oxygen absorbent disposed outside the storage container wherein
a ventilation groove which communicates an internal portion of the storage container and an outside of the storage container is formed on an engagement surface where the container main body and the lid body are engaged,
   the internal portion accommodating a scrub member and surrounded by the container main body and the lid body.

* * * * *